US012701967B2

(12) United States Patent
Amarilio et al.

(10) Patent No.: US 12,701,967 B2
(45) Date of Patent: Aug. 4, 2026

(54) SUBSTRATE HANDLING SYSTEM BACKGROUND

(71) Applicant: Applied Materials Israel Ltd., Rehovot (IL)

(72) Inventors: David Amarilio, Rehovot (IL); Dima Apter, Rehovot (IL); Mariano Abramson, Rehovot (IL)

(73) Assignee: Applied Materials Israel Ltd., Rehovot (IL)

( * ) Notice: Subject to any disclaimer, the term of this patent is extended or adjusted under 35 U.S.C. 154(b) by 0 days.

(21) Appl. No.: 19/000,285

(22) Filed: Dec. 23, 2024

(65) Prior Publication Data

US 2026/0182306 A1 Jun. 25, 2026

(51) Int. Cl.
| | |
|---|---|
| *H10P 72/78* | (2026.01) |
| *C23C 16/458* | (2006.01) |
| *H10P 72/00* | (2026.01) |
| *H10P 72/70* | (2026.01) |

(52) U.S. Cl.
CPC ............ *H10P 72/78* (2026.01); *C23C 16/458* (2013.01); *C23C 16/4586* (2013.01); *H10P 72/06* (2026.01); *H10P 72/70* (2026.01)

(58) Field of Classification Search
CPC .......... H10P 72/78; H10P 72/06; H10P 72/70; C23C 16/458; C23C 16/4586
USPC .......................... 279/3; 118/728; 156/345.51
See application file for complete search history.

(56) References Cited

U.S. PATENT DOCUMENTS

| | | | |
|---|---|---|---|
| 7,430,104 | B2 | 9/2008 | Litman et al. |
| 9,622,375 | B2 | 4/2017 | Busche et al. |
| 11,749,551 | B2 | 9/2023 | Nishri et al. |
| 2013/0164147 | A1* | 6/2013 | Graham ................. F04C 28/00 417/53 |
| 2024/0274462 | A1 | 8/2024 | Fujiwara et al. |
| 2024/0290572 | A1 | 8/2024 | Dudovitch et al. |
| 2024/0293917 | A1 | 9/2024 | Ifergan |
| 2025/0153292 | A1 | 5/2025 | Cafri |

FOREIGN PATENT DOCUMENTS

KR          102505676 B1          2/2023

OTHER PUBLICATIONS

PCT/US2025/051732, "International Search Report and Written Opinion", Feb. 11, 2026, 9 pages.

* cited by examiner

*Primary Examiner* — Jeffrie R Lund
(74) *Attorney, Agent, or Firm* — Kilpatrick Townsend & Stockton LLP

(57) ABSTRACT

A substrate handling system, that includes (i) a vacuum booster for generating a pulse of first vacuum flow; (ii) a reference vacuum source for producing a reference vacuum flow; and (iii) an vacuum flow control unit that is configured to: (a) combine, during a boost period, the first and reference vacuum flows to provide a combined vacuum flow that is provided, via conduits, to upper vacuum openings of a chuck, and (b) provide the reference vacuum flow to the upper vacuum openings during a substrate fastening period, wherein the chuck and the vacuum booster are spaced apart from each other and are mechanically coupled to a stage.

20 Claims, 6 Drawing Sheets

18

31

32-2 32-3

33-1 33-2 33-3

34

Reference vacuum source 30

Second opening 62

First conduit 61 74

64

First upper vacuum openings 71

18

34

41

52 42

Housing 20

Flow control unit 40

Vacuum booster 50

Second upper vacuum openings 72

Chuck 70

66

65

Third upper vacuum openings 73

75

76

Controller 90

Stage 80

Third conduit 63

61

99

Housing 20

62

76

78

63

Stage 80

Initial state

First substrate straightening period 101

Boost period 102

First post-boost period 103

Second post-boost period 104

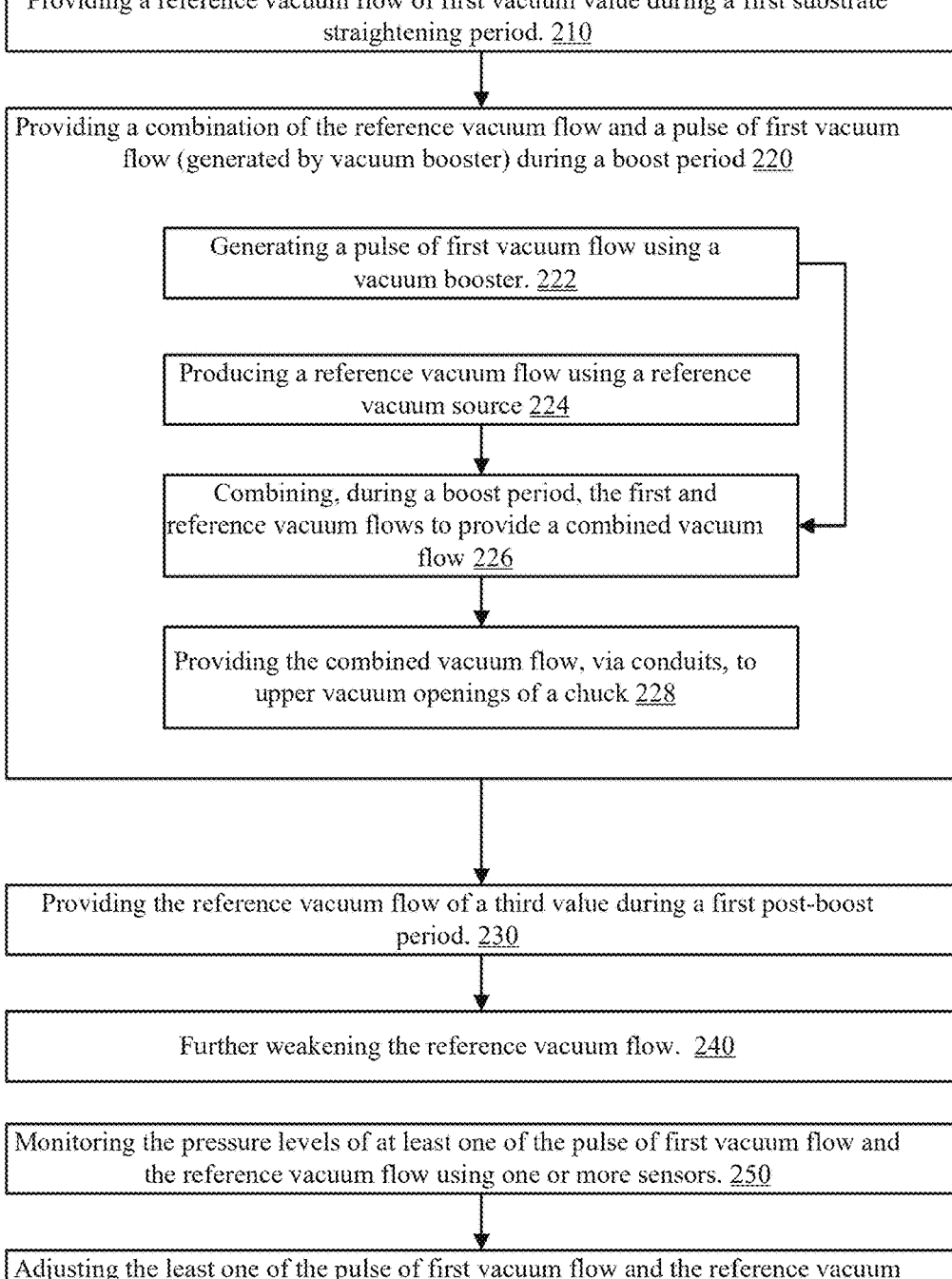

Providing a reference vacuum flow of first vacuum value during a first substrate straightening period. 210

Providing a combination of the reference vacuum flow and a pulse of first vacuum flow (generated by vacuum booster) during a boost period 220

Generating a pulse of first vacuum flow using a vacuum booster. 222

Producing a reference vacuum flow using a reference vacuum source 224

Combining, during a boost period, the first and reference vacuum flows to provide a combined vacuum flow 226

Providing the combined vacuum flow, via conduits, to upper vacuum openings of a chuck 228

Providing the reference vacuum flow of a third value during a first post-boost period. 230

Further weakening the reference vacuum flow. 240

Monitoring the pressure levels of at least one of the pulse of first vacuum flow and the reference vacuum flow using one or more sensors. 250

Adjusting the least one of the pulse of first vacuum flow and the reference vacuum flow. 252

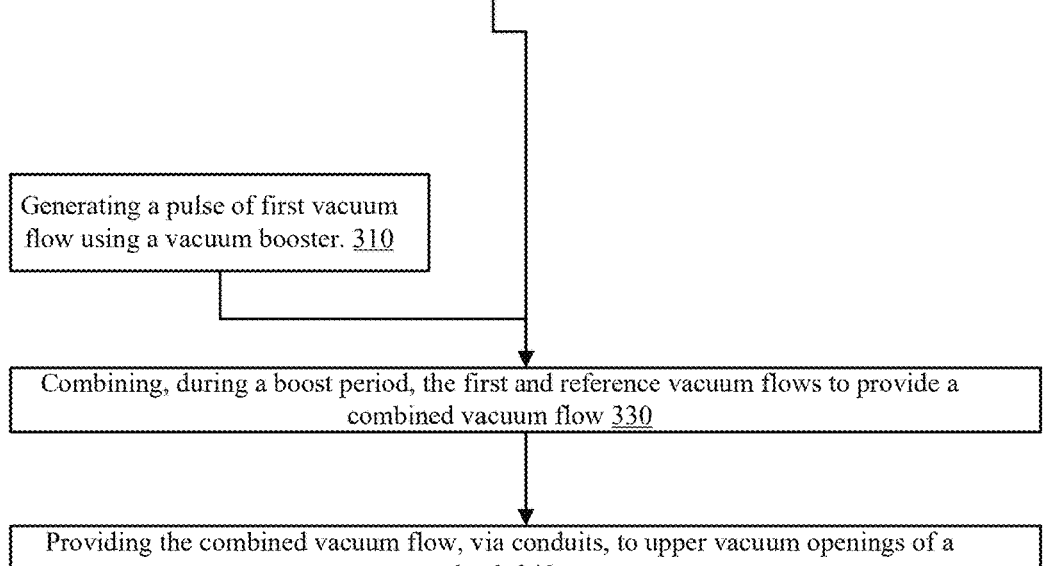

Producing a reference vacuum flow using a reference vacuum source 320

Providing the reference vacuum flow having a first vacuum value during a first substrate straightening period that precedes the boost period. 321

Providing the reference vacuum flow of a second vacuum value during the boost period. 322

Providing the reference vacuum flow of a third value during a first post-boost period, wherein the first value exceeds the third value. 323

Providing the reference vacuum flow having a fourth vacuum value during a second post-boost period, wherein the third value exceeds the fourth value. 324

Receiving a pressurized vacuum flow by a venturi pump of a reference vacuum source and outputting the reference vacuum flow to multiple supply branches in parallel using the venturi pump. 325

Selecting a value of the reference vacuum flow to be provided to the conduits using vacuum flow regulators and vacuum flow valves included in a vacuum flow control unit. 326

Generating a pulse of first vacuum flow using a vacuum booster. 310

Combining, during a boost period, the first and reference vacuum flows to provide a combined vacuum flow 330

Providing the combined vacuum flow, via conduits, to upper vacuum openings of a chuck 340

Monitoring the pressure levels of at least one of the pulse of first vacuum flow and the reference vacuum flow using one or more sensors. 350

Adjusting the least one of the pulse of first vacuum flow and the reference vacuum flow. 360

SUBSTRATE HANDLING SYSTEM
BACKGROUND

BACKGROUND OF THE INVENTION

In the field of semiconductor manufacturing, substrate handling is a crucial aspect. The substrate needs to be precisely and securely positioned for various processing steps. This positioning is typically achieved using a chuck, a specialized tool designed to hold the substrate in place. The chuck often uses vacuum technology to secure the substrate, creating a vacuum flow that holds the substrate in place.

However, the efficiency and effectiveness of this process can be influenced by several factors, including the flatness of the substrate.

Therefore, there is a continuous need for improvements in substrate handling systems to enhance the precision, reliability, and efficiency of substrate positioning.

BRIEF SUMMARY OF THE INVENTION

According to an embodiment, there is provided a substrate handling system that includes (i) a vacuum booster for generating a pulse of first vacuum flow; (ii) a reference vacuum source for producing a reference vacuum flow; and (iii) a vacuum flow control unit that is configured to: (a) combine, during a boost period, the first vacuum flow and the reference vacuum flow to provide a combined vacuum flow that is provided, via conduits, to upper vacuum openings of a chuck, and (b) provide the reference vacuum flow to the upper vacuum openings during a substrate fastening period, wherein the chuck and the vacuum booster are spaced apart from each other and are mechanically coupled to a stage.

According to an embodiment, there is provided a method for handling a substrate, the method includes (a) generating a pulse of first vacuum flow using a vacuum booster; (b) producing a reference vacuum flow using a reference vacuum source; (c) combining, during a boost period, the first and reference vacuum flows to provide a combined vacuum flow; (d) providing the combined vacuum flow, via conduits, to upper vacuum openings of a chuck; and (e) providing the reference vacuum flow to the upper vacuum openings during a substrate fastening period.

BRIEF DESCRIPTION OF THE DRAWINGS

The subject matter regarded as the embodiment is particularly pointed out and distinctly claimed in the concluding intermediate portion of the specification. The embodiment, however, both as to organization and method of operation, together with specimen s, features, and advantages thereof, may best be understood by reference to the following detailed description when read with the accompanying drawings in which:

FIG. 5 illustrates an example of a method; and

FIG. 6 illustrates an example of a method.

DETAILED DESCRIPTION OF THE INVENTION

Figure 1:
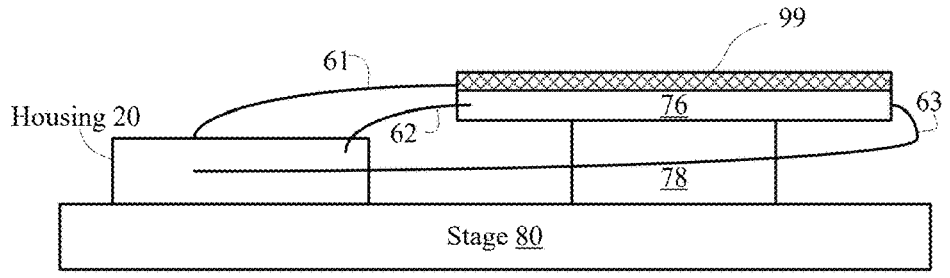
FIG. 1 illustrates an example of substrate handling system.

There is provided a substrate handling system, that includes (i) a vacuum booster for generating a pulse of first vacuum flow; (ii) a reference vacuum source for producing a reference vacuum flow; and (iii) an vacuum flow control unit that is configured to: (a) combine, during a boost period, the first vacuum flow and the reference vacuum flow to provide a combined vacuum flow that is provided via conduits to upper vacuum openings of a chuck, and (b) provide the reference vacuum flow to the upper vacuum openings during a substrate fastening period, wherein the chuck and the vacuum booster are spaced apart from each other and are mechanically coupled to a stage.

According to an embodiment, a warped substrate is flattened using a combination of a pulse of first vacuum flow and a reference vacuum flow. The pulse is generated by a vacuum booster that is close to the chuck (for example up to 10, 20, 30, 40, 50, 60 centimeters) in order to reduce leakage between the pulse source and the chuck.

Using a combination of a vacuum boost and a reference vacuum flow eases the requirements regarding the flow rate and vacuum value of the reference vacuum flow.

According to an embodiment, the substrate handling system is configured to provide different negative pressure values based on a progress of a substrate flattening process and also following the completion of the substrate flattening process. For example, once the substrate is flattened, it is beneficial to reduce the vacuum level in order to reduce the warpage of the substrate due to the supply of vacuum. According to an embodiment, the substrate is a wafer.

According to an embodiment, the substrate handling system is configured to:

a. Provide a reference vacuum flow of first vacuum value during a first substrate straightening period to reduce the distance between the edge of the substrate and the chuck.

b. Provide the combination of the reference vacuum flow (of a second vacuum value) and the pulse of first vacuum flow during the boost period—in order to complete the straightening of the substrate and the minimizing of the distance between the substrate and the chuck.

c. Provide the reference vacuum flow of a third value during a first post-boost period, wherein the first value exceeds the third value. After the substrate was straightened, a lower level of vacuum may be applied due to the reduced distance between the flattened substrate and the chuck, and there is no need to rely on the vacuum pulse.

d. According to an embodiment, the reference vacuum flow is further weakened to further reduce vacuum that induced a warping of the substrate. For example, the substrate handling system may be configured to provide the reference vacuum flow having a fourth vacuum value during a second post-boost period, wherein the third value exceeds the fourth value.

It should be noted that the substrate handling system is configured to execute only some of steps (a), (b), (c) and (d), for example only steps (a), (b) and (c) are executed by the substrate handling system.

Figure 2:
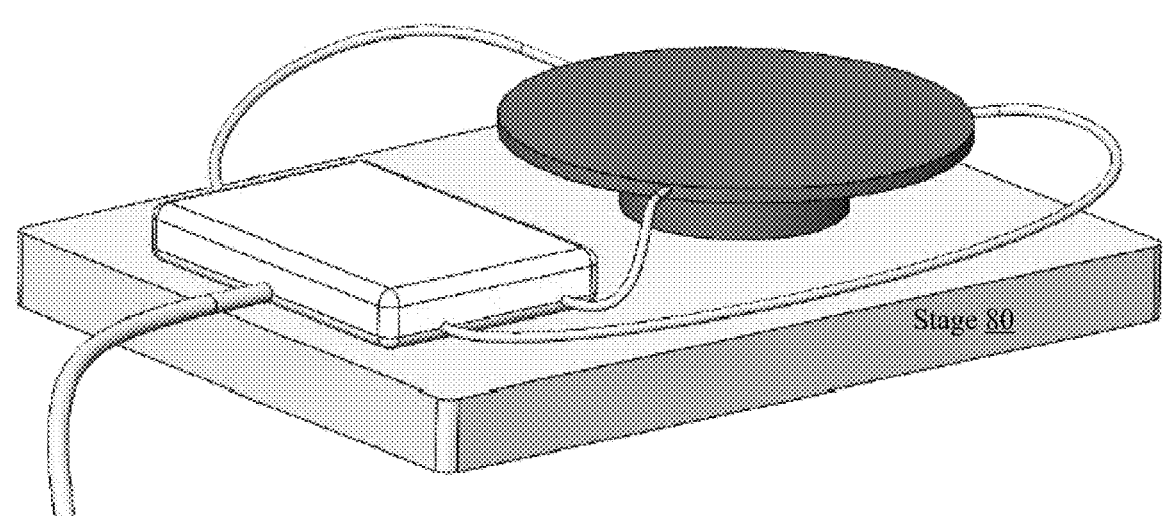
FIG. 2 illustrates an example of substrate handling system.
Figure 2:
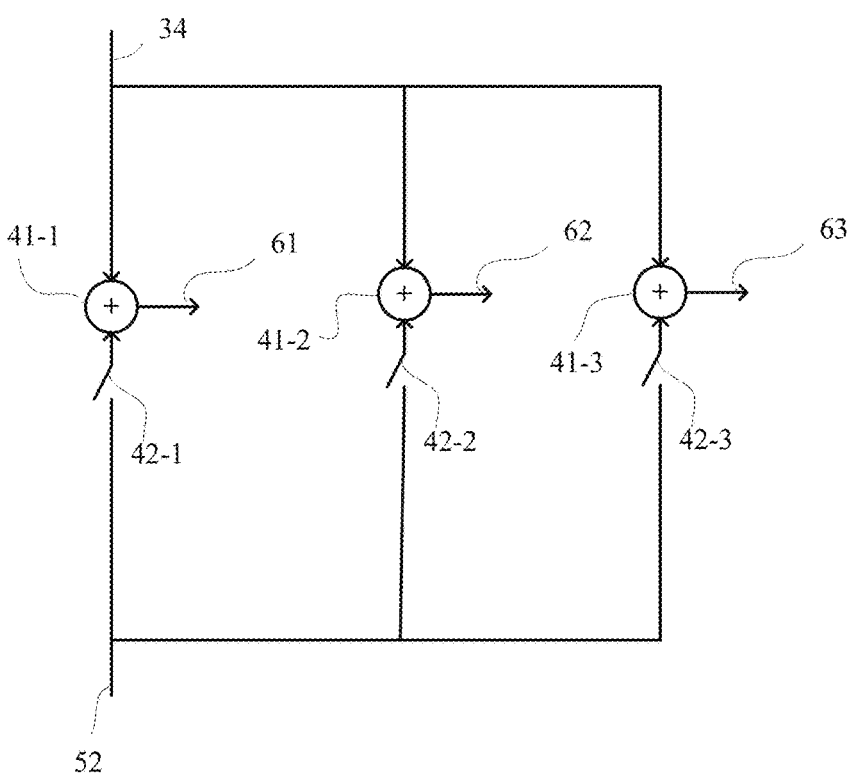
Figure 3:
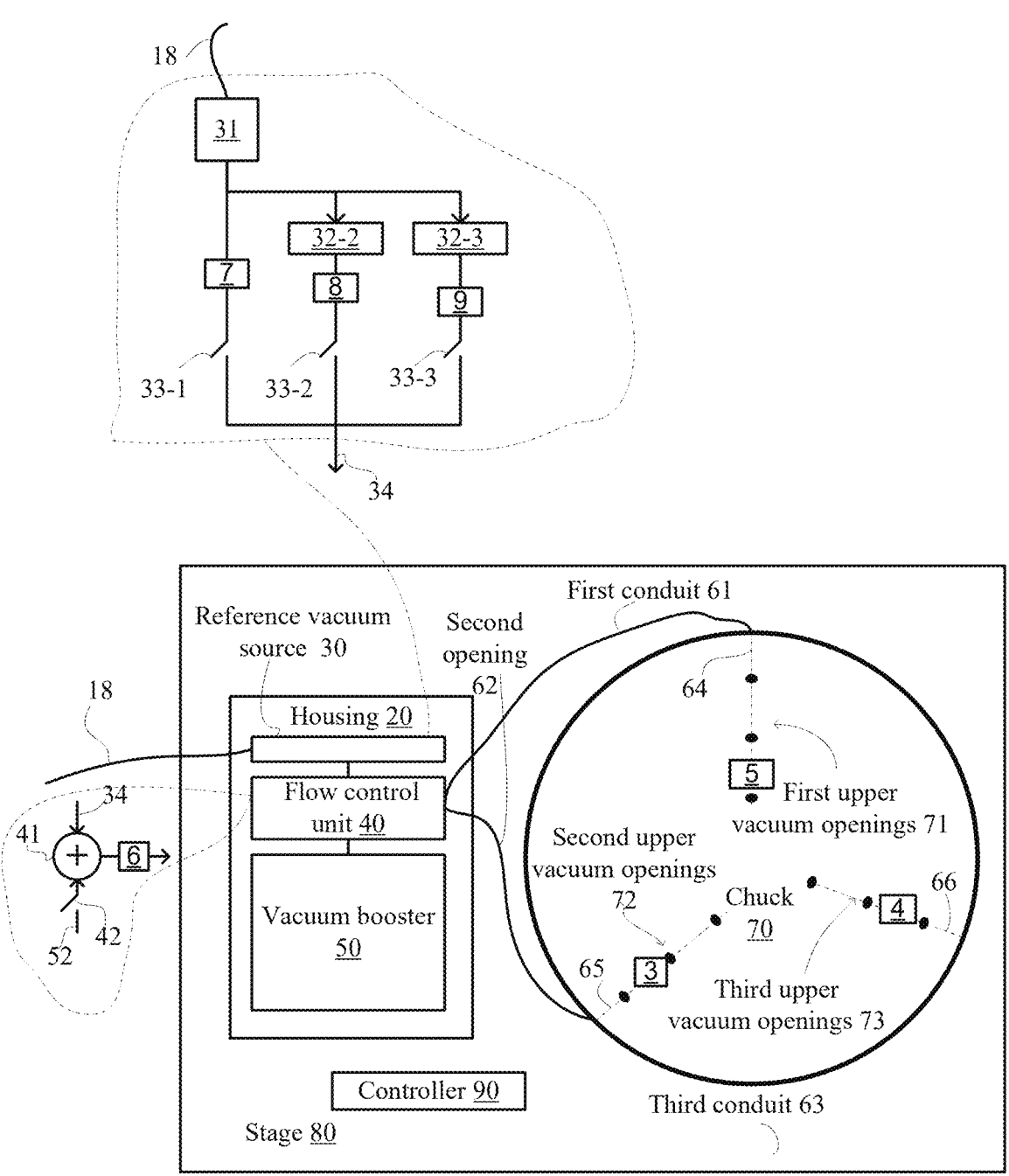
FIG. 3 illustrates an example of substrate handling system.

FIGS. 1, 2 and 3 illustrate examples of a substrate handling system, which includes (i) a vacuum booster 50 for generating a pulse of first vacuum flow; (ii) a reference vacuum source 30 for producing a reference vacuum flow; and (iii) a vacuum flow control unit 40 that is configured to:

a. Combine, during a boost period, the pulse of the first vacuum flow and the reference vacuum flow to provide a combined vacuum flow that is provided, via conduits to upper vacuum openings of the chuck 70. The conduits may include first conduit 61, second conduit 62, third conduit 63, first chuck conduit 64, second chuck conduit 65 and third chuck conduit 66. The first conduit 61, second conduit 62, third conduit 63 may be external to the chuck. The first chuck conduit 64, second chuck conduit 65 and third chuck conduit 66 may be formed in the chuck. The upper vacuum openings may include a first set of upper vacuum openings 71, a second set of upper vacuum openings 72, and a third set of upper vacuum openings 73.

b. Provide the reference vacuum flow to the upper vacuum openings during a substrate fastening period.

According to an embodiment, the first conduit 61 interfaces with a first region 74 of chuck 70, the second conduit 62 interfaces with a second region 75 of chuck 70, and the third conduit 63 interfaces with a third region 76 of chuck 70. The regions are spaced apart from each other.

The chuck 70 and the vacuum booster 50 are spaced apart from each other and are mechanically coupled to a stage 80. The stage is configured to move substrate 99 during an evaluation period.

FIG. 1 also illustrates that the chuck 70 has an upper portion 76 and a lower portion 78.

FIG. 1 further illustrates a housing 20 in which the reference vacuum source 30, the flow control unit 40 and the vacuum booster 50 are located.

Having the vacuum booster 50 outside the chuck and spaced apart from the chuck simplifies the chuck, enables to increase the size of the vacuum booster, and allows to use off the shelf chucks that do not include built in chucks.

FIG. 1 also illustrates the reference vacuum source 30 as including venturi pump 31, first vacuum flow control unit 33-1, second vacuum flow control unit 33-2, first regulator 32-2, third vacuum flow control unit 33-3, and second regulator 32-3 to form three branches that end at output port 34.

The venturi pump may be replaced by another source of vacuum flow. There may be two or more than three branches for providing two or more than three different reference vacuum flow levels. The vacuum flow level may be changed in a continuous manner.

The venturi pump 31 is configured to receive a pressurized vacuum flow from input conduit 18 and output a reference vacuum flow.

The reference vacuum flow outputted by the venturi pump has a first vacuum value.

The first vacuum flow control unit 33-1 is configured to allow or prevent the passage of the vacuum flow between the venturi pump 31 and the output port 34.

The reference vacuum flow outputted from the venturi pump is inputted to the first regulator 32-2. The second vacuum flow control unit 33-2 is configured to allow or prevent the passage of the vacuum flow between the first regulator 32-2 and the output port 34.

According to an embodiment, the reference vacuum flow outputted by the first regulator 32-2 has a third vacuum value which is lower (less vacuum) that the first value.

The reference vacuum flow outputted from the venturi pump is also inputted to the second regulator 32-3. The third vacuum flow control unit 33-3 is configured to allow or prevent the passage of the vacuum flow between the second regulator 32-3 and the output port 34. According to an embodiment, the reference vacuum flow outputted by the second regulator 32-3 has a fourth vacuum value which is lower (less vacuum) that the first value.

Non-limiting examples of vacuum values include −94 kPa, −70 kPa, and −30 kPa. Any other vacuum levels may be provided. The second vacuum value may equal the first vacuum level.

FIG. 1 also illustrates the flow control unit 40 as including an adder 41 and a switch 52 for allowing or preventing the passage of the pulse of vacuum flow to the adder.

During the boost period, the vacuum booster outputs, via vacuum booster output port 52, a pulse of first vacuum flow. The pulse of first vacuum flow is provided, through switch 52 to adder 41. Adder 41 also receives, through output port 34, the reference vacuum flow. Adder 42 combines the pulse of first vacuum flow and the reference vacuum flow to provide a combined vacuum flow that is sent to first conduit 61, second conduit 62 and third conduit 63.

During a substrate fastening period that differs from the boost period, the adder receives only the reference vacuum flow.

FIG. 1 also illustrates controller 90 that is configured to control the supply of vacuum flow.

FIG. 2 illustrates an adder and a switch per each conduit- which reduces the overall side of the switches that are implemented by solenoids. FIG. 2 illustrates (i) a first adder 41-1 and a first switch 42-1 that are allocated to first conduit 61, (ii) a second adder 41-2 and a second switch 42-2 that are allocated to second conduit 62, and (iii) a third adder 41-3 and a third switch 42-3 that are allocated to third conduit 63.

According to an embodiment, the substrate handling system is configured to adjust the reference vacuum source to provide varying levels of vacuum. This adjustment can be made in response to feedback from sensors to meet the specific requirements of the substrate handling process.

According to an embodiment, the substrate handling system is configured to adjust the vacuum booster to provide varying levels of vacuum. This adjustment can be made in response to feedback from sensors to meet the specific requirements of the substrate handling process.

According to an embodiment, the substrate handling system includes one or more sensors to measure the pressure levels of the pulse generated by the vacuum booster and/or the reference vacuum flow from the reference vacuum source. These measurements are used to verify that the system maintains the correct vacuum levels for handling the substrate. The data collected by the one or more sensors is used to confirm substrate handling system performance and to adjust the vacuum flow as needed to ensure the substrate is fastened properly to the chuck.

FIG. 3 illustrates a substrate handling system as also including sensors 3, 4, 5, 6, 7, 8 and 9 located in various locations of the substrate handling system and configured to measure the vacuum value at the various locations. According to an embodiment, there are fewer sensos than six, or any other number of sensors.

The controller 90 is configured to set a value of any vacuum flow generated by the reference vacuum source 30 and/or the vacuum booster 50 based on the reading of the sensors.

Figure 4:
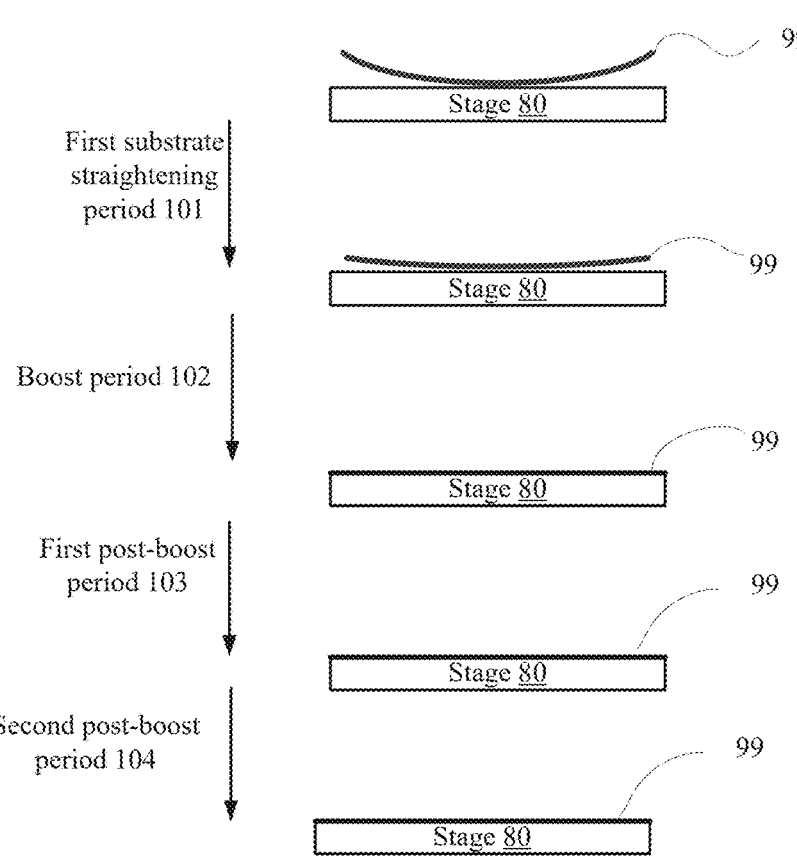
FIG. 4 illustrates an example of substrate straightening process.

FIG. 4 illustrates the substrate during various stages of a substrate handling process.

a. Initial state: substrate 99 is warped.

b. First substrate straightening period 101 reduces the warpage of the substrate.

c. Boost period 102 straightens the substrate 99.

d. First post-boost period 103 maintains the substrate straight and fastened to the chuck and reduces vacuum induced warpage.

e. Second post-boost period 104 maintains the substrate straight and fastened to the chuck, and further reduces vacuum induced warpage.

FIG. 5 illustrates method 200 for handling a substrate.

According to an embodiment, method 200 starts by step 210 of providing a reference vacuum flow of first vacuum value during a first substrate straightening period in order to reduce the distance between the edge of the substrate and the chuck. The reference vacuum flow is provided, via conduits, to upper vacuum openings of a chuck.

According to an embodiment, step 210 is followed by step 220 of providing a combination of the reference vacuum flow (of a second vacuum value that may equal the first vacuum level) and a pulse of first vacuum flow (generated by vacuum booster) during the boost period. Step 220 is aimed at completing the straightening of the substrate and the minimizing of the distance between the substrate and the chuck. The combined vacuum flow is provided, via conduits, to upper vacuum openings of a chuck.

According to an embodiment, step 220 is followed by step 230 of providing the reference vacuum flow of a third value during a first post-boost period, wherein the first value exceeds the third value. After the substrate was straightened, a lower level of vacuum may be applied due to the reduced distance between the flattened substrate and the chuck, and there is no need to rely on the vacuum pulse. The reference vacuum flow is provided, via conduits, to upper vacuum openings of a chuck.

According to an embodiment, step 230 is followed by step 240 of further weakening the reference vacuum flow to further reduce vacuum induced warping of the substrate. Step 240 may include providing the reference vacuum flow having a fourth vacuum value during a second post-boost period, wherein the third value exceeds the fourth value. The reference vacuum flow is provided, via conduits, to upper vacuum openings of a chuck.

According to an embodiment, step 220 includes:

a. Step 222 of generating a pulse of first vacuum flow using a vacuum booster.

b. Step 224 of producing a reference vacuum flow using a reference vacuum source.

c. Step 226 of combining, during a boost period, the first and reference vacuum flows to provide a combined vacuum flow.

d. Step 228 of providing the combined vacuum flow, via conduits, to upper vacuum openings of a chuck.

According to an embodiment, method 200 includes step 250 of monitoring the pressure levels of at least one of the pulse of first vacuum flow and the reference vacuum flow using one or more sensors. According to an embodiment, step 250 is followed by step 252 of adjusting the at least one of the pulse of first vacuum flow and the reference vacuum flow based on real-time substrate handling conditions using a feedback system. Steps 250 and 252 may be executed in parallel to any one of steps 210, 220, 230 and 240.

FIG. 6 illustrates method 300 for handling a substrate.

According to an embodiment, method 300 includes steps 310 and 320.

Step 310 includes generating a pulse of first vacuum flow using a vacuum booster.

Step 320 includes producing a reference vacuum flow using a reference vacuum source.

According to an embodiment, step 310 and 320 are followed by step 330 of combining, during a boost period, the first and reference vacuum flows to provide a combined vacuum flow.

According to an embodiment, step 330 is followed by step 340 of providing the combined vacuum flow, via conduits, to upper vacuum openings of a chuck. According to an embodiment, the conduits interface spaced apart regions of the chuck.

According to an embodiment, method 300 also includes step 340 of providing the reference vacuum flow to the upper vacuum openings during a substrate fastening period. Step 340 is preceded by step 320.

According to an embodiment, method 300 includes step 350 of monitoring the pressure level of at least one of the pulse of first vacuum flow and the reference vacuum flow using one or more sensors.

According to an embodiment, step 350 is followed by step 360 of adjusting the at least one of the pulse of first vacuum flow and the reference vacuum flow based on real-time substrate handling conditions using a feedback system.

According to an embodiment, step 320 includes adjusting the reference vacuum source to vary the reference vacuum flow. The adjustment may be responsive to the stage or phase of a substrate handling process. See, for example, the different periods of FIG. 4.

According to an embodiment, step 320 includes:

a. Step 321 of providing the reference vacuum flow having a first vacuum value during a first substrate straightening period that precedes the boost period.

b. Step 322 of providing the reference vacuum flow of a second vacuum value during the boost period.

c. Step 323 of providing the reference vacuum flow of a third value during a first post-boost period, wherein the first value exceeds the third value.

d. Step 324 of providing the reference vacuum flow having a fourth vacuum value during a second post-boost period, wherein the third value exceeds the fourth value.

e. Step 325 of receiving a pressurized vacuum flow by a venturi pump of a reference vacuum source and outputting the reference vacuum flow to multiple supply branches in parallel using the venturi pump.

f. Step 326 of selecting a value of the reference vacuum flow to be provided to the conduits using vacuum flow regulators and vacuum flow valves included in a vacuum flow control unit.

According to an embodiment, method 200 is implemented by the substrate handling system of FIGS. 1-3.

According to an embodiment, method 300 is implemented by the substrate handling system of FIGS. 1-3.

According to an embodiment, any combination of any step of method 200 and any step of method 300 is provided.

It will be appreciated that for simplicity and clarity of illustration, elements shown in the figures may be either of scale or may have been drawn out of scale. For example, the dimensions of some of the elements may be exaggerated relative to other elements for clarity. Yet for another example, the dimensions of elements are of scale. Further, where considered appropriate, reference numerals may be repeated among the figures to indicate corresponding or analogous elements.

In the foregoing detailed description, numerous specific details are set forth to provide a thorough understanding of the embodiments of the disclosure.

However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding intermediate portion of the specification. The embodiments of the disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the disclosure may for the most part, be implemented using mechanical components and circuits known to those skilled in the art, details will not be explained in any greater extent than that considered necessary as illustrated above, for the understanding and appreciation of the underlying concepts of the present embodiments of the disclosure and in order not to obfuscate or distract from the teachings of the present embodiments of the disclosure.

Any reference in the specification to a method should be applied mutatis mutandis to a manipulator capable of executing the method.

Any reference in the specification to a manipulator should be applied mutatis mutandis to a method that may be executed by the manipulator.

The term "and/or" means additionally or alternatively. For example, A and/or B means only A, or only B or A and B.

In the foregoing description, numerous specific details are set forth to provide a thorough understanding of the embodiments of the disclosure.

However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding intermediate portion of the specification. The embodiments of the disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Any reference in the specification to a support unit should be applied mutatis mutandis to a method that may be executed by the support unit.

The term "and/or" means additionally or alternatively. For example, A and/or B means only A, or only B or A and B.

In the foregoing specification, the embodiments of the disclosure have been described with reference to specific examples of embodiments. It will, however, be evident that various modifications and changes may be made therein without departing from the broader spirit and scope of the appended claims.

Moreover, the terms "front," "back," "top,", "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Any reference to the term "comprising" or "having" or "including" should be applied mutatis mutandis to "consisting of" and/or should be applied mutatis mutandis to "consisting essentially of".

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps than those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any claim containing such introduced claim element to embodiments containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments have been illustrated and described herein, many modifications, substitutions, changes, and equivalents will now occur to those of ordinary skill in the art. It is, therefore, to be understood that the appended claims are intended to cover all such modifications and changes as fall within the true spirit of the embodiment.

What is claimed is:

1. A substrate handling system, comprising:
a vacuum booster for generating a pulse of first vacuum flow;
a reference vacuum source for producing a reference vacuum flow;
a vacuum flow control unit configured to:
(a) combine, during a boost period, the first vacuum flow and the reference vacuum flow to provide a combined vacuum flow that is provided, via conduits, to upper vacuum openings of a chuck, and
(b) provide the reference vacuum flow to the upper vacuum openings during a substrate fastening period, wherein the chuck and the vacuum booster are spaced apart from each other and are mechanically coupled to a stage.

2. The substrate handling system of claim 1, wherein the vacuum flow control unit comprises one or more sensors for monitoring a pressure level of at least one of the pulse of first vacuum flow and the reference vacuum flow.

3. The substrate handling system of claim 1, wherein the conduits interface with spaced apart regions of the chuck.

4. The substrate handling system of claim 1, further comprising a feedback system to adjust the at least one of the pulse of first vacuum flow and the reference vacuum flow based on real-time substrate handling conditions using a feedback system.

5. The substrate handling system of claim 1, wherein the reference vacuum source is adjustable to vary the reference vacuum flow.

6. The substrate handling system of claim 1, wherein the reference vacuum source is configured to provide the reference vacuum flow having a first vacuum value during a first substrate straightening period that precedes the boost period and is configured to provide the reference vacuum flow of a second vacuum value during the boost period.

7. The substrate handling system of claim 6, wherein the reference vacuum source is configured to provide the reference vacuum flow of a third value during a first post-boost period, wherein the first value exceeds the third value.

8. The substrate handling system of claim 7, wherein the reference vacuum source is configured to provide the reference vacuum flow having a fourth vacuum value during a second post-boost period, wherein the third value exceeds the fourth value.

9. The substrate handling system of claim 1, wherein the reference vacuum source comprises a venturi pump that configured to receive a pressurized vacuum flow and is configured to output the reference vacuum flow to multiple supply branches in parallel.

10. The substrate handling system of claim 9, wherein the vacuum flow control unit comprises vacuum flow regulators and vacuum flow valves that are configured to select a value of the reference vacuum flow to be provided to the conduits.

11. A method for handling a substrate with a substrate handling system, the method comprising:

generating a pulse of first vacuum flow using a vacuum booster;

producing a reference vacuum flow using a reference vacuum source; and using a vacuum flow control unit to:

combine, during a boost period, the first and reference vacuum flows to provide a combined vacuum flow;

provide the combined vacuum flow, via conduits, to upper vacuum openings of a chuck; and provide the reference vacuum flow to the upper vacuum openings during a substrate fastening period.

12. The method of claim 11, further comprising monitoring a pressure level of at least one of the pulse of first vacuum flow and the reference vacuum flow using one or more sensors.

13. The method of claim 11, further comprising interfacing the conduits with spaced apart regions of the chuck.

14. The method of claim 11, further comprising adjusting the at least one of the pulse of first vacuum flow and the reference vacuum flow based on real-time substrate handling conditions using a feedback system.

15. The method of claim 11, further comprising adjusting the reference vacuum source to vary the reference vacuum flow.

16. The method of claim 11, further comprising providing the reference vacuum flow having a first vacuum value during a first substrate straightening period that precedes the boost period and providing the reference vacuum flow of a second vacuum value during the boost period.

17. The method of claim 16, further comprising providing the reference vacuum flow of a third value during a first post-boost period, wherein the first value exceeds the third value.

18. The method of claim 17, further comprising providing the reference vacuum flow having a fourth vacuum value during a second post-boost period, wherein the third value exceeds the fourth value.

19. The method of claim 11, wherein the reference vacuum source comprises a venturi pump, further comprising receiving a pressurized vacuum flow and outputting the reference vacuum flow to multiple supply branches in parallel using the venturi pump.

20. The method of claim 19, further comprising selecting a value of the reference vacuum flow to be provided to the conduits using vacuum flow regulators and vacuum flow valves included in a vacuum flow control unit.

* * * * *